United States Patent [19]
Ackley et al.

[11] Patent Number: 5,258,316
[45] Date of Patent: Nov. 2, 1993

[54] PATTERENED MIRROR VERTICAL CAVITY SURFACE EMITTING LASER

[75] Inventors: Donald E. Ackley; Chan-Long Shieh, both of Paradise Valley, Ariz.

[73] Assignee: Motorola, Inc., Schaumburg, Ill.

[21] Appl. No.: 858,288

[22] Filed: Mar. 26, 1992

[51] Int. Cl.[5] .............................................. H01L 21/20
[52] U.S. Cl. ...................................... 437/24; 372/45; 437/38; 437/129
[58] Field of Search .......................... 437/129, 24, 38; 372/45–50, 96, 97

[56] References Cited

U.S. PATENT DOCUMENTS

| | | | |
|---|---|---|---|
| 4,740,481 | 4/1988 | Wilson et al. | 437/24 |
| 4,949,350 | 8/1990 | Jewell et al. | 372/45 |
| 5,034,958 | 7/1991 | Kwon et al. | 372/45 |
| 5,088,099 | 2/1992 | Chen et al. | 372/45 |
| 5,115,441 | 5/1992 | Kopf et al. | 372/45 |
| 5,132,982 | 7/1992 | Chau et al. | 372/50 |
| 5,206,871 | 4/1993 | Deppe et al. | 372/45 |

FOREIGN PATENT DOCUMENTS 0021090 1/1991 Japan ................................... 372/46
0021091 1/1991 Japan ................................... 372/46

OTHER PUBLICATIONS

Geels et al. "Submilliamp threshold Vertical Cavity Laser-Diodes", Appl. Phys. Letts. 57(1990), pp. 1605–1607.

Geels et al., "Low threshold Planarised Vertical-Cavity surface-emitting lasers", IEEE Photonics Technology Letters 2(1990), pp. 234–236.

Yang et al., "Low threshold operation of a GaAs Single Quantum well mushroom structure surface-Emitting Laser", Appl. Phys. Letts. 58(1991), pp. 1780–1782.

Primary Examiner—Olik Chaudhuri
Assistant Examiner—Kamamohan Rao Paladugu
Attorney, Agent, or Firm—Eugene A. Parsons

[57] ABSTRACT

VCSELs including a central active layer with upper and lower mirror stacks wherein a circular trench is formed in one mirror stack to define a lasing area. The trench reduces reflectivity to prevent lasing outside the operating area and an oxygen implant in the trench confines current distribution to maximize power output and efficiency. The trench allows self-alignment throughout most of the manufacturing process.

9 Claims, 1 Drawing Sheet

PATTERENED MIRROR VERTICAL CAVITY SURFACE EMITTING LASER

The present invention pertains to vertical cavity surface emitting lasers (VCSELs) and more specifically to VCSELs with higher power and greater efficiency.

BACKGROUND OF THE INVENTION

Conventional edge emitting semiconductor lasers are playing a significant role in development of optical communications due to their high operating efficiency, small size and modulation capabilities. However, with increasing performance needs, further reduction in size, and greater manufacturing needs, these devices have been experiencing limitations.

Recently, there has been an increased interest in a new type of laser device called a vertical cavity surface emitting laser (VCSEL). Advantages of VCSEL devices are that the device is smaller, has potentially higher performance, and is potentially more manufacturable. These advantages are due in part from advances in epitaxial deposition techniques such as metal organic vapor phase epitaxy (MOVPE) and molecular beam epitaxy (MBE).

However, even with these advances in deposition techniques there is difficulty during manufacturing in controlling the mode of operation of the laser and in controlling current distribution within the laser. In general, VCSELs are formed by depositing a plurality of layers on a substrate and then etching the layers down to the substrate to form the VCSEL. See, for example, U.S. Pat. No. 5,034,092, entitled "Plasma Etching of Semiconductor Substrates", issued Jul. 23, 1991, assigned to the same assignee and included herein by reference.

The etching of mesas to form VCSELs has two disadvantages. The etching process damages the crystal at the surface and leads to increased threshold currents and reduced reliability. The mesas form a waveguide with a large discontinuity in the refractive index which makes it very difficult to control the optical modes without making devices of very small dimension, which increases the series resistance and reduces the maximum output power. Generally this results in devices which are less efficient and less stable.

SUMMARY OF THE INVENTION

It is a purpose of the present invention to provide new and improved VCSELs that are easier to manufacture.

It is a further purpose of the present invention to provide new and improved VCSELs that produce higher output power and have a higher efficiency.

The above problems and others are solved and the purposes realized by a method of fabricating a vertical cavity surface emitting laser including first and second stacks of mirrors deposited on either side of an active layer, the method including the steps of defining an operating area in the second stack of mirrors, and etching the second stack of mirrors to form a trench surrounding the operating area and extending the depth of the trench sufficiently to reduce reflectivity below an amount required to support lasing in a volume of the laser between the trench and the active layer.

Further, the above problems and others are solved and the purposes realized by a surface emitting laser including an active layer with opposed major surfaces, a first mirror stack on one major surface of the active layer, and a second mirror stack on the other major surface of the active layer, the second mirror stack having an operating area defined by a trench extending from a major surface of the second mirror stack toward the active layer, the trench surrounding the operating area and extending sufficiently deep to reduce reflectivity below an amount required to support lasing in a volume of the laser between the trench and the active layer.

BRIEF DESCRIPTION OF THE DRAWINGS

Referring to the drawings.

DESCRIPTION OF THE PREFERRED EMBODIMENT

Figure 1:
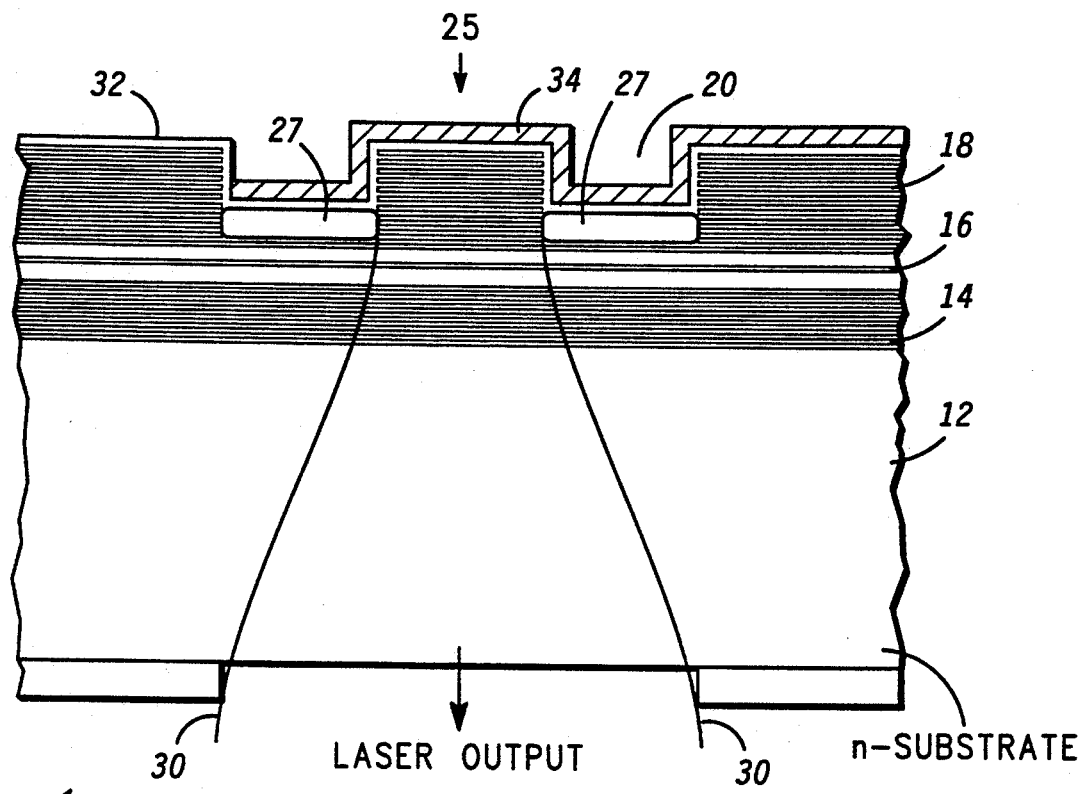
FIG. 1 is a sectional view of a vertical cavity surface emitting laser incorporating the present invention.

Referring specifically to FIG. 1, a vertical cavity surface emitting laser 10 is illustrated in a sectional view. Laser 10 is formed on a substrate 12, which in this example, is made of n-doped gallium arsenide. Gallium arsenide is used as substrate 12 to facilitate epitaxial growth of multiple layers of gallium arsenide and aluminum arsenide. It should be understood that other semiconductor substrates could be used as well.

Epitaxial deposition of multiple alternate layers of different compositions is accomplished by well known techniques in the art such as MBE, MOCVD, or the like. These techniques enable epitaxial deposition of relatively thin and thick layers of a variety of materials such as gallium arsenide, aluminum gallium arsenide, aluminum arsenide, indium phosphide or the like. Fabrication of VCSEL devices use epitaxial deposition extensively to produce the multitude of layers of different materials which make up the device.

Deposition of alternating layers of doped gallium arsenide and aluminum arsenide form a first stack 14 of reflectors or mirrors for laser 10. Thicknesses of alternating layers of gallium arsenide and aluminum arsenide are set at approximately one quarter of the wavelength at which the device is designed to operate. Nominal thicknesses for the gallium arsenide layers and the aluminum arsenide layers are on the order of 665 angstroms and 800 angstroms, respectively.

A typical active layer 16 is formed as follows. A cladding region is epitaxially deposited on first mirror stack 14 to form a first major surface of active layer 16. The cladding region typically has two parts which are not shown to avoid overcrowding of FIG. 1. First, a silicon doped aluminum gallium arsenide layer, which is approximately 800 angstroms thick, is deposited on first mirror stack 14. Second, an undoped aluminum gallium arsenide layer, which is approximately 500 angstroms thick, is deposited on the silicon doped aluminum gallium arsenide layer. An active region is epitaxially deposited on the cladding region 13, which active region is commonly made of two barrier regions deposited on either side of a center strained quantum well region. The two barrier regions are made of approximately 100 angstroms each of undoped gallium arsenide. Multiple quantum wells and barriers may be used to increase the available gain. The strained quantum well region is generally made of undoped indium gallium arsenide with an approximate thickness of 80 angstroms. A second cladding region is epitaxially deposited to form a second major surface of active layer 16. The second cladding region is commonly made of two parts. First, approximately 500 angstroms of undoped aluminum gallium arsenide is deposited on active region 17. Second, approximately 800 angstroms of beryllium doped aluminum gallium arsenide is deposited on the undoped aluminum gallium arsenide.

A second stack 18 of reflectors or mirrors is epitaxially deposited on the second cladding region of active layer 16. Second mirror stack 18 is composed of alternating layers of beryllium doped gallium arsenide and aluminum arsenide. Thickness of the last alternating layer is approximately one half wave length instead of one quarter wave length as is used for the other alternating layers. Generally, the threshold current of a VCSEL is reduced by increasing the number of alternating layers in mirror stacks 14 and 18.

Once first mirror stack 14, active layer 16 and second mirror stack 18 are completed, the structure must be patterned to form one or more individual VCSELs. In the present specific embodiment the patterning is accomplished as follows. The upper surface of second mirror stack 18 is provided with a layer of photoresist material in any of the well known methods. The photoresist layer is exposed and material is removed to define the position and size of a trench 20. Trench 20 is then formed by etching mirror stack 18 by any convenient means, such as ion milling or the etch processes disclosed in the above identified patent '092. In general, trench 20 extends completely around and defines an operating area 25, which in this specific embodiment has a generally circular cross-section.

In this specific embodiment, trench 20 extends into mirror stack 18 from the upper surface thereof, to a depth of almost one half the complete dimension of first mirror stack 14, active layer 16 and second mirror stack 18. While this depth is convenient for reasons that will become apparent presently, it is only necessary that trench 20 be sufficiently deep to reduce reflectivity of mirror stack 18 in the volume between the bottom of trench 20 and active layer 16 so that lasing in that volume is not supported. In at least some applications lasing will not be supported when the reflectivity is reduced to less than approximately 98%. It should be noted that the optical mode of operation will generally be determined by the depth to which trench 20 is etched.

Figure 2:
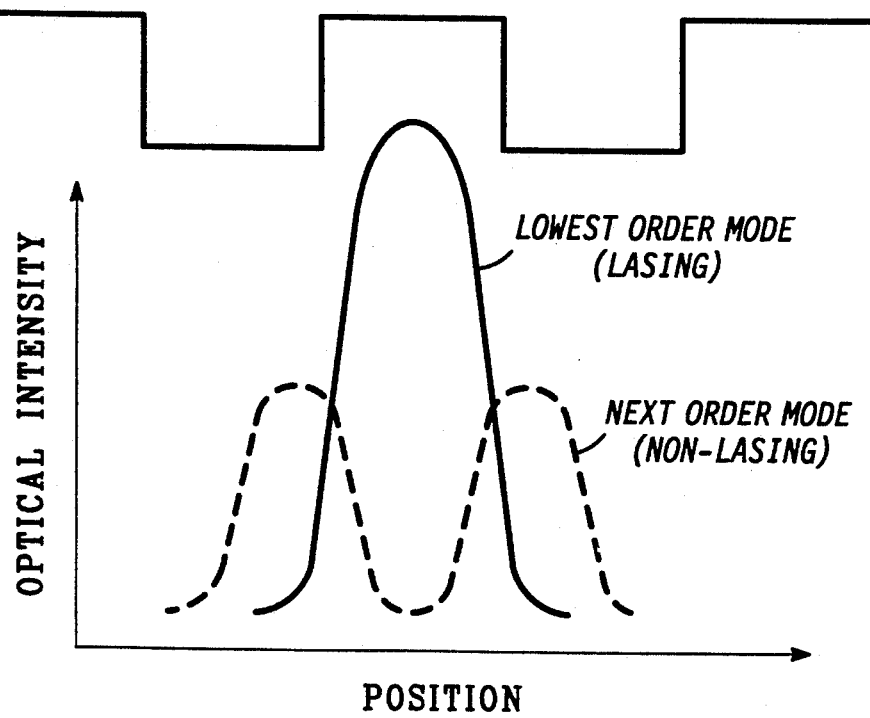
FIG. 2 is a graphical representation of the lasing modes of the laser of FIG. 1 in comparison to the surface area thereof.

Operating area 25, surrounded by trench 20, is essentially a mesa with a generally circular cross-section. The operating wavelength (frequency) of laser 10 is already determined by the construction (material, etc.) and dimensions of active layer 16 and the dimensions of mirror stacks 14 and 18. Further, as is well known in the art, VCSELs are desired to operate in a lowest order mode. Thus, the mode size, or the maximum volume that can be utilized to sustain the lowest order mode of operation is easily determined. Referring to FIG. 2, a graphical representation of the lasing modes of laser 10 in comparison to the surface area thereof are illustrated. The distance D is generally the greatest area that will support operation in the lowest order mode without including any higher order modes of operation.

In the present method of manufacture, the mode size for the lowest order mode is predetermined and the diameter of operating area 25 is set equal thereto. Since lasing only occurs within the volume below operating area 25, masking the structure for etching of trench (or trenches) 20 is not crucial. In general, the depth of trench 20 will be such that no contact with active layer 16 is made, so that reliability is enhanced. Also, the width of trench 20 is not crucial and may be any convenient width, depending upon the application and following manufacturing steps.

Because operating area 25 of laser 10 is set substantially equal to the mode size of the operating, or lowest order, mode, the output or emission spot of laser 10 is maximized. Maximizing the emission spot of laser 10 maximizes the output power thereof.

With trench 20 formed to the desired depth, a layer 27 of oxygen implant is formed in the bottom thereof and annealed to form a high resistance area to current flow. Layer 27 confines current flow within laser 10 to a volume generally within lines 30. Also, lines 30 generally define the volume of laser 10 within which lasing occurs because of the reflectivity reduction produced by trench 20. By controlling current distribution to only the desired lasing area a minimum of current is wasted and the efficiency of laser 10 is maximized. Further, the larger area of operation, while increasing the threshold current, reduces the series resistance and further increases the output power. Oxygen implant layer 27 controls current spreading, independent of the depth of trench 20.

To complete the construction of laser 10, a layer 32 of SiNx, which may be any of the well known silicon-nitrogen compounds such as silicon nitride, etc., is deposited over the entire upper surface of second mirror stack 18, trench 20 and operating area 25. Layer 32 may be any convenient masking/insulation layer to protect the surface of laser 10. A substantially planar layer of photoresist is then applied over layer 32. Because the layer of photoresist is thicker in trench 20, photoresist can be removed from operating area 25 using only a crude alignment. The portion of SiNx layer 32 overlying operating area 25 is then removed and laser 10 is patterned for p-metalization lift-off and bonding pads, represented by a metal layer 34. A second metal layer 36 is deposited on the lower surface of laser 10, which in this embodiment is the lower surface of substrate 12, to form a second electrical contact. Typically, metal layers 34 are made of titanium, platinum, gold, while layer 36 may be nickel, germanium, gold. Metal layers 34 and 36 are fabricated so that geometric patterns are formed by using a common liftoff process. It should be understood that other masking structures and methods could be used to fabricate geometric patterns such as photoresist, dielectrics or the like.

Thus, a new and improved VCSEL is disclosed which is simple to manufacture because of the self-alignment of the mirror etch and the oxygen implant and the virtually self-aligned dielectric Via etch on the mesa. Further, because of the optical mode control provided by the trench and the the current distribution control provided by the oxygen implant, the power output and efficiency of the laser are maximized. Finally, while the manufacture of a single laser has been discussed herein, it will be understood that individual lasers, arrays of lasers, semiconductor wafers of lasers, etc. can easily be manufactured by the disclosed process.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. A method of fabricating a vertical cavity surface emitting laser including first and second stacks of mirrors deposited on either side of an active layer comprising the steps of:
   defining an operating area in the second stack of mirrors;
   etching the second stack of mirrors to form a trench surrounding the operating area and extending the depth of the trench sufficiently to reduce reflectivity below an amount required to support lasing in a volume of the laser between the trench area and the active layer.

2. A method of fabricating a vertical cavity surface emitting laser as set forth in claim 1 wherein the etching is performed by ion milling.

3. A method of fabricating a vertical cavity surface emitting laser as claimed in claim 1 including in addition the step of implanting oxygen in the bottom of the trench.

4. A method of fabricating a vertical cavity surface emitting laser as claimed in claim 3 including in addition the steps of depositing a layer of SiNx over the second mirror stack, the trench and the implanted oxygen, applying a substantially planar layer of photoresist over the SiNx layer, removing portions of the layer of photoresist overlying the operating area, removing the portion of the SiNx layer overlying the operating area and depositing an electrical contact in the operating area.

5. A method of fabricating a vertical cavity surface emitting laser as claimed in claim 1 wherein the step of defining an operating area includes the steps of applying a layer of photoresist to the second mirror stack and patterning the photoresist to define a trench area which is not covered by photoresist.

6. A method of fabricating a vertical cavity surface emitting laser comprising the steps of:
   providing a substrate with first and second opposed major surfaces;
   depositing a first stack of mirrors on the first major surface of the substrate;
   depositing an active layer on the first stack of mirrors;
   depositing a second stack of mirrors on the active layer;
   defining an operating area in the second stack of mirrors;
   etching the second stack of mirrors to form a trench surrounding the operating area and extending the depth of the trench sufficiently to reduce reflectivity below an amount required to support lasing in a volume of the laser between the trench area and the active layer.

7. A method of fabricating a vertical cavity surface emitting laser as claimed in claim 6 including in addition the step of implanting oxygen in the bottom of the trench.

8. A method of fabricating a vertical cavity surface emitting laser as claimed in claim 7 including in addition the steps of depositing a layer of SiNx over the second mirror stack, the trench and the implanted oxygen, applying a substantially planar layer of photoresist over the SiNx layer, removing portions of the layer of photoresist overlying the operating area, removing the portion of the SiNx layer overlying the operating area and depositing an electrical contact in the operating area.

9. A method of fabricating a vertical cavity surface emitting laser as claimed in claim 6 wherein the step of defining an operating area includes the steps of applying a layer of photoresist to the second mirror stack and patterning the photoresist to define a trench area which is not covered by photoresist.

* * * * *